(12) United States Patent
Meisner et al.

(10) Patent No.: US 8,646,261 B2
(45) Date of Patent: Feb. 11, 2014

(54) THERMOELECTRIC GENERATORS INCORPORATING PHASE-CHANGE MATERIALS FOR WASTE HEAT RECOVERY FROM ENGINE EXHAUST

(75) Inventors: Gregory P. Meisner, Ann Arbor, MI (US); Jihui Yang, Lakeshore (CA)

(73) Assignee: GM Global Technology Operations LLC, Detroit, MI (US)

( * ) Notice: Subject to any disclaimer, the term of this patent is extended or adjusted under 35 U.S.C. 154(b) by 760 days.

(21) Appl. No.: 12/892,983

(22) Filed: Sep. 29, 2010

(65) Prior Publication Data
US 2012/0073276 A1  Mar. 29, 2012

(51) Int. Cl.
| F01N 3/00 | (2006.01) |
| F01N 3/02 | (2006.01) |
| F01N 3/20 | (2006.01) |
| H01L 35/30 | (2006.01) |

(52) U.S. Cl.
USPC .............................. 60/320; 60/324; 136/205

(58) Field of Classification Search
USPC ..................................... 60/320, 324; 136/205
See application file for complete search history.

(56) References Cited

U.S. PATENT DOCUMENTS

| 7,921,640 B2* | 4/2011 | Major ............................ 60/320 |
| 2005/0072142 A1 | 4/2005 | Sasaki et al. |
| 2009/0229649 A1 | 9/2009 | Yang et al. |
| 2010/0111754 A1 | 5/2010 | Yang et al. |
| 2010/0155675 A1 | 6/2010 | Yang et al. |
| 2010/0186398 A1 | 7/2010 | Huber |
| 2010/0186399 A1* | 7/2010 | Huttinger ........................ 60/320 |
| 2010/0186422 A1 | 7/2010 | Yang et al. |
| 2010/0281866 A1 | 11/2010 | Reynolds et al. |
| 2011/0308560 A1* | 12/2011 | Arbuckle et al. ............. 136/205 |

FOREIGN PATENT DOCUMENTS

WO    2011037526    3/2011

* cited by examiner

*Primary Examiner* — Thomas Denion
*Assistant Examiner* — Dapinder Singh
(74) *Attorney, Agent, or Firm* — Reising Ethington P.C.

(57) ABSTRACT

Thermoelectric devices, intended for placement in the exhaust of a hydrocarbon fuelled combustion device and particularly suited for use in the exhaust gas stream of an internal combustion engine propelling a vehicle, are described. Exhaust gas passing through the device is in thermal communication with one side of a thermoelectric module while the other side of the thermoelectric module is in thermal communication with a lower temperature environment. The heat extracted from the exhaust gasses is converted to electrical energy by the thermoelectric module. The performance of the generator is enhanced by thermally coupling the hot and cold junctions of the thermoelectric modules to phase-change materials which transform at a temperature compatible with the preferred operating temperatures of the thermoelectric modules. In a second embodiment, a plurality of thermoelectric modules, each with a preferred operating temperature and each with a uniquely-matched phase-change material may be used to compensate for the progressive lowering of the exhaust gas temperature as it traverses the length of the exhaust pipe.

10 Claims, 7 Drawing Sheets

THERMOELECTRIC GENERATORS INCORPORATING PHASE-CHANGE MATERIALS FOR WASTE HEAT RECOVERY FROM ENGINE EXHAUST

This invention was made with U.S. Government support under Agreement No. DEAC050000R22725 awarded by the Department of Energy. The U.S. Government may have certain rights in this invention.

TECHNICAL FIELD

This invention pertains to devices and methods for efficiently extracting at least a portion of the thermal energy in an internal combustion engine exhaust stream and converting the extracted energy to electrical energy.

BACKGROUND OF THE INVENTION

Advances in the efficiency of both spark-ignition and compression-ignition internal combustion engines have contributed significantly to improved fuel economy of vehicles. Despite these improvements in engine efficiency an appreciable fraction of the available energy in the fuel is discharged as waste heat, a sizeable portion of which is discharged at high temperature in the vehicle exhaust.

Yet further increases in vehicle fuel economy could be achieved if at least a portion of the waste heat contained in the exhaust stream could be efficiently captured.

SUMMARY OF THE INVENTION

Many automotive vehicles have a gasoline-fueled or diesel-fueled engine in the front of the vehicle with a combustion gas exhaust conduit that connects to the exhaust manifold of the engine and leads under the vehicle to the rear where the exhaust is discharged. This exhaust passage comprises sections of high temperature resistant alloy steel pipes that typically carry the hot engine exhaust to and from a catalyzed exhaust gas treatment container, an exhaust resonator and a muffler for removing pollutants from the exhaust and managing its noise. The steel exhaust pipes are usually round with an internal diameter of about 70 mm to about 100 mm The temperature of the exhaust gas exiting the exhaust manifold at any time is a function of how long the engine has been running and how much fuel it is consuming, and may range from high temperatures of about 500° C. to a hundred degrees or more lower. Oxidation reactions in a catalytic converter often increase exhaust temperatures downstream of the converter.

In accordance with embodiments of this invention, the exhaust conduit system also includes one or more thermoelectric modules, each comprising a suitably-packaged assembly comprising a plurality of thermoelectric elements with integral electrical interconnections and connectors for extraction of electrical energy. The designated high temperature sides of the thermoelectric elements (within the modules) are heated by hot exhaust gas and the lower temperature sides are cooled. So the thermoelectric module generates electrical energy from the exhaust and conducts it to a nearby storage battery for use in components on the vehicle. Often the lower temperature side (the cold side) of the thermoelectric module is cooled, for example, by ambient air or by engine coolant. A thermoelectric device comprises an array of thermoelectric modules are arranged around the circumference (or perimeter) of the exhaust gas path (or a conduit member for the exhaust) and along the flow axis of the exhaust to provide a desired heat transfer contact area between the high temperature side of the module and the flowing gas.

Thermoelectric compositions are selected for effective operation at a temperature (or narrow temperature range) within typical expected upper levels of exhaust gas temperatures for a vehicle engine-exhaust system. In embodiments of this invention, one or more volumes of phase-change material are placed co-extensively between the hot exhaust gas and the high temperature side of thermoelectric modules. The composition of the phase-change material is selected to undergo melting and solidification cycles at the desired high-temperature side of the thermoelectric elements. Thus, the amount of phase-change material, its melting temperature, and its specific latent heat serve as a stabilizing temperature moderator for heat transfer between the thermoelectric material and the often continually-varying temperature of the exhaust gas. Similarly, a lower temperature phase-change material may be used between the low temperature side of the thermoelectric material and a medium used in heat exchange with the designated low temperature side of the thermoelectric module. Depending on the length of the thermoelectric device along the exhaust path and the typical temperature drop of the exhaust gas within such length, additional different phase-change materials and thermoelectric materials may be used in the hot and cold sides of down-stream modules. These downstream modules may be adapted for more efficiently extracting energy from the lower, downstream temperature engine exhaust.

If, during infrequent sustained periods of elevated exhaust temperature, for example when climbing a long grade or when towing a heavy load, the entire volume of phase-change material is transformed to its high temperature phase, it will be incapable of storing additional heat at constant temperature and the temperature of the phase-change material, and correspondingly, the temperature of the thermoelectric module, will increase. If a thermoelectric module overheats and exceeds its preferred operating temperature the thermoelectric elements might be oxidized or decompose or otherwise degrade.

Thus, the exhaust system may be modified by incorporation of a bypass (exhaust) pipe which branches off the exhaust pipe upstream of the thermoelectric device and rejoins the exhaust pipe downstream of the thermoelectric module. By means of a suitable valve, the exhaust gas may be directed through the thermoelectric module or through the bypass pipe. When the phase-change material can no longer absorb heat without increase in temperature, the exhaust gas may be directed though the bypass pipe. The capabilities of the phase-change material may be assessed by measuring its temperature and this signal may be used to control and actuate the valve to direct the exhaust gas as appropriate.

A variant of this concept is to admit ambient air into the exhaust stream in suitable proportion to maintain the air and exhaust gas mixture near or in a preferred temperature range. This temperature range may be selected so that the heat absorption capabilities of the phase-change material will not be exceeded and no overheating of a thermoelectric module will occur. Preferably the vent valve would be controlled using at least an integral controller and opened and closed with an actuator incorporating a sensor to report actuator position. More preferably, proportional-integral or proportional-integral-derivative control may be employed.

Other objects and advantages of the invention will be apparent from a description of preferred embodiments which follows in this specification.

DESCRIPTION OF PREFERRED EMBODIMENTS

Figure 1:
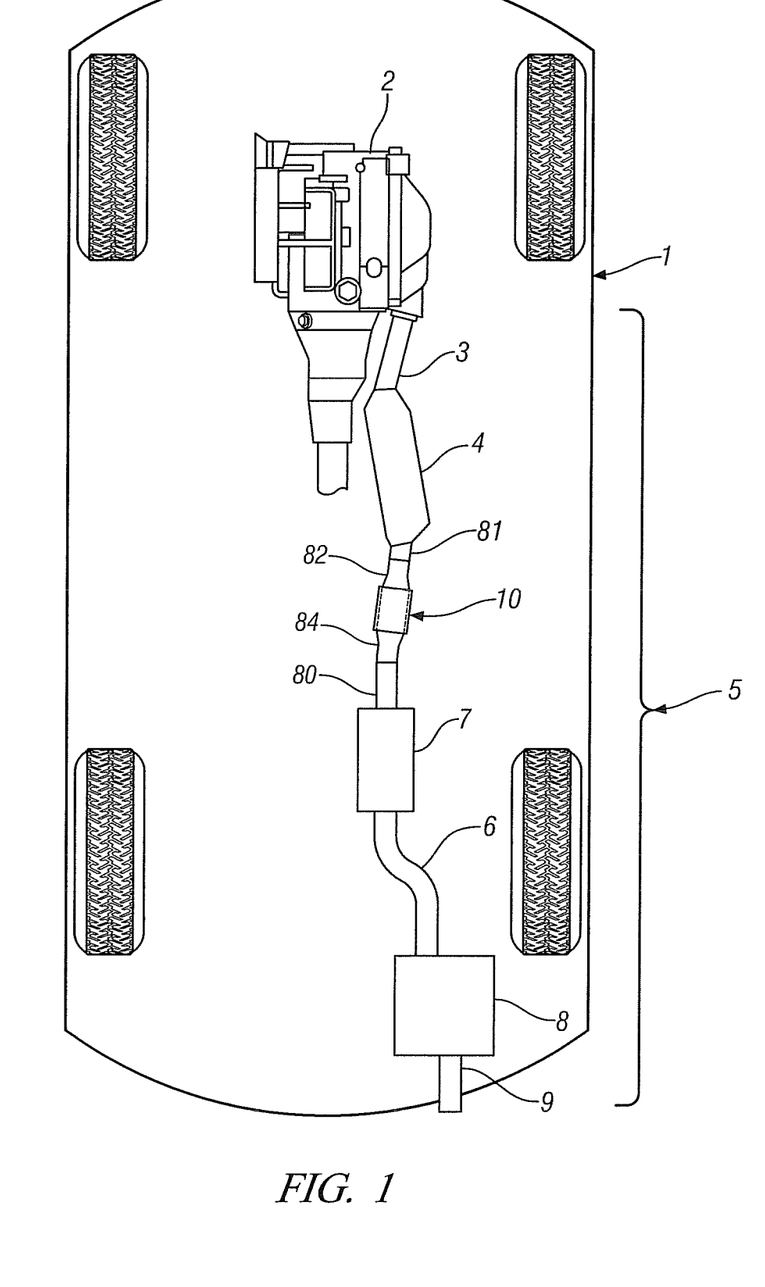
FIG. 1 shows, in cutaway plan view a vehicle engine, exhaust system and thermoelectric device arranged for efficient extraction of thermal energy from a vehicle exhaust.

FIG. 1 shows, in plan view cutaway, the engine 2 and exhaust system 5 of an automobile 1 as well as a portion of the drive-train by which the engine power is delivered to the rear wheels to propel the vehicle. The exhaust system may comprise major elements and devices such as a catalytic convertor 4, a resonator 7, a muffler 8 and a tailpipe 9 each adapted for passage of exhaust from engine 2 and each serially interconnected by a plurality of hollow pipes or pipe segments identified as 3, 81, 82, 84, 80 and 6. Also shown in exhaust system 5 is a thermoelectric device 10, adapted for extraction of electrical energy from the thermal energy of the engine exhaust stream.

To enhance catalytic activity on cold engine start, catalytic convertor 4 is preferably positioned as close to the engine as possible. Thermoelectric device 10 is then preferably positioned downstream of but close to, catalytic convertor 6 where the exhaust gas is hottest. This will generally result in the thermoelectric device being located between catalytic convertor 4 and the resonator 7, if the vehicle is so equipped, or between the catalytic convertor 4 and muffler 8 in vehicles without a resonator or vehicles in which the resonator and muffler are commonly packaged.

Thermoelectric modules employ two different (but complementary) thermoelectric materials, compactly packaged and with suitable electrical interconnects for producing an electrical current when separated junctions are subjected to a suitable temperature differential. Such power generation thermoelectric modules exploit the Seebeck effect, a phenomenon in which a temperature gradient is applied across a body and as a result an open circuit voltage, co-linear to the temperature gradient, is established.

Many thermoelectric material combinations may be employed, but semiconductor materials, which offer higher performance than many competing materials, are preferred. For such semiconductor materials the polarity of the voltage with respect to the applied temperature gradient is dependent on the nature of the majority charge carriers. When a temperature difference exists between ends of a thermoelectric element, heated charge carriers (electrons or holes) flow towards the cooler end. Where a pair of dissimilar thermoelectric semiconductor elements, that is a pair consisting of an n-type element and a p-type element, are suitably connected together to form an electrical circuit, a direct current flows in that circuit.

Several families of semiconductor thermoelectric material compounds have been discovered and developed. Among these compounds, skutterudite ($CoSb_3$ or $Co_4Sb_{12}$) is an example. Cubic $Co_4Sb_{12}$ possesses two voids in a crystallographic unit cell. The voids may be filled, partially or completely, for example, with one or more rare-earth, alkaline-earth, or alkali metal elements. Such partial filling approaches may be used to adjust or tune thermoelectric properties of the crystalline material. The skutterudites display semiconductor properties and distinct compositions can be formed with p-type (hole charge carriers) and n-type (electron charge carriers) conductivity. Many other thermoelectric compositions are known and available.

The capabilities of thermoelectric materials and modules are generally represented in terms of a figure of merit, Z, defined as:

$$Z=\sigma S^2/\kappa,$$

where σ is the electrical conductivity, κ is the thermal conductivity, and S is the Seebeck coefficient or thermopower which has units of voltage per (degree) kelvin. More commonly, a dimensionless figure of merit ZT is used, where T is the average of the hot and cold temperatures to which the module is exposed. Greater values of ZT indicate greater thermodynamic efficiency. For thermoelectric modules, as opposed to elements, ZT may also be used as a figure of merit provided the two materials of the couple have similar Z values.

Figure 2:
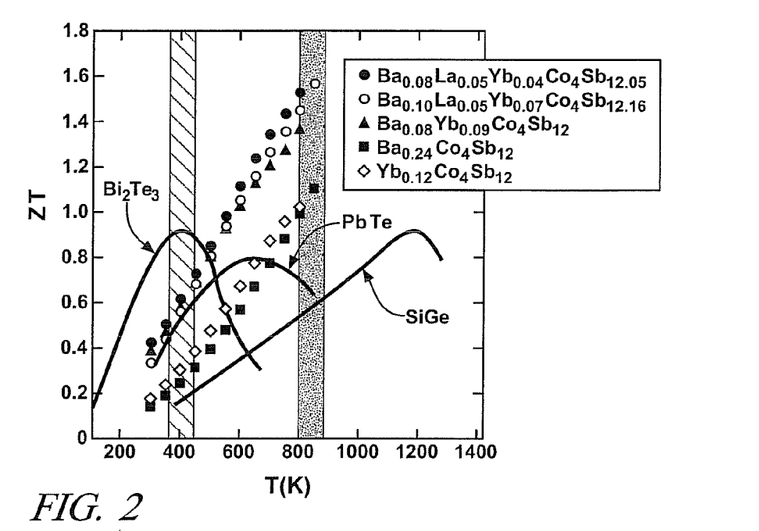
FIG. 2 is a plot of the variation of the dimensionless figure of merit for thermoelectric materials (ZT) as a function of the average of the hot and cold junction temperatures.

As shown in FIG. 2, a plot of ZT versus temperature for a number of thermoelectric materials, the efficiency with which thermoelectric materials convert thermal energy to electrical energy depends both on the material and its temperature. Thus, optimal energy conversion results when the thermoelectric material exhibits its maximum value of ZT at the operating temperature of the module. As shown in FIG. 2, partially-filled p-type and n-type doped skutterudites based on the composition $Co_4Sb_{12}$ and containing varying proportions of Ba, La and Yb exhibit a combined ZT of about 1.2 between about 800 and 900 K, a typical exhaust gas temperature range for both spark-ignition and compression-ignition engines. Thus, the partially-filled $Co_4Sb_{12}$ doped skutterudites offer superior performance over some alternative thermoelectric materials including $Bi_2Te_3$, PbTe and SiGe whose figure of merit, ZT is also shown in FIG. 2. The anticipated operating temperature range of the device, however, encompasses the temperature of about 850 K at which $Co_4Sb_{12}$ may decompose. It is therefore mandatory that the operating temperature of $Co_4Sb_{12}$-based skutterudite thermoelectric materials be well controlled.

Figure 3:
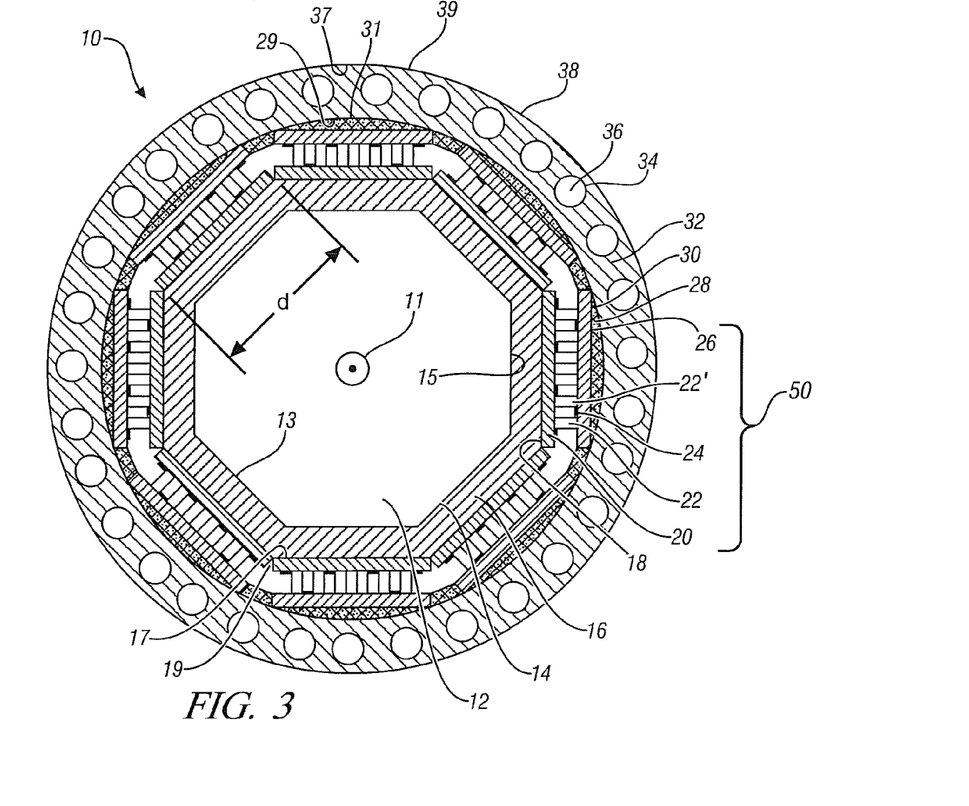
FIG. 3 is a cross-section of one embodiment of an exemplary thermoelectric device and incorporating a plurality of thermoelectric modules in thermal communication with a high temperature phase-change material at their hot junction and a low temperature phase-change material at their cold junction.

A section through a representative suitable device 10 for extracting electrical energy from engine exhaust gases is shown in FIG. 3. Exhaust gas 12, contained by inner tube surfaces 13 flows in the interior of thin-walled octagonal tube 14 having a center 11. Thin wall octagonal tubes 14, 18 and thin wall round tubes 30 and 38 are arranged in spaced-apart, nested relation and have centers generally aligned and coincident with center 11. Thin-walled octagonal tube 18 is located in spaced-apart relation to tube 14 and the gap between outer wall 15 of tube 14 and inner wall 17 of tube 18 is filled with a high-temperature phase-change material 16. A plurality of thermoelectric modules 50 are positioned between thin-walled octagonal tube 18 and thin-walled round tube 30.

The temperature of the exhaust gas exiting the catalytic converter of a diesel engine may range from about 190° C. to about 500° C. in normal operation, depending on load. As will be discussed more fully later, the role of the high-temperature phase-change material 16 is to moderate or damp these changes in exhaust temperature so that the hot side of thermoelectric module 50 is maintained at a more constant operating temperature.

Figure 4:
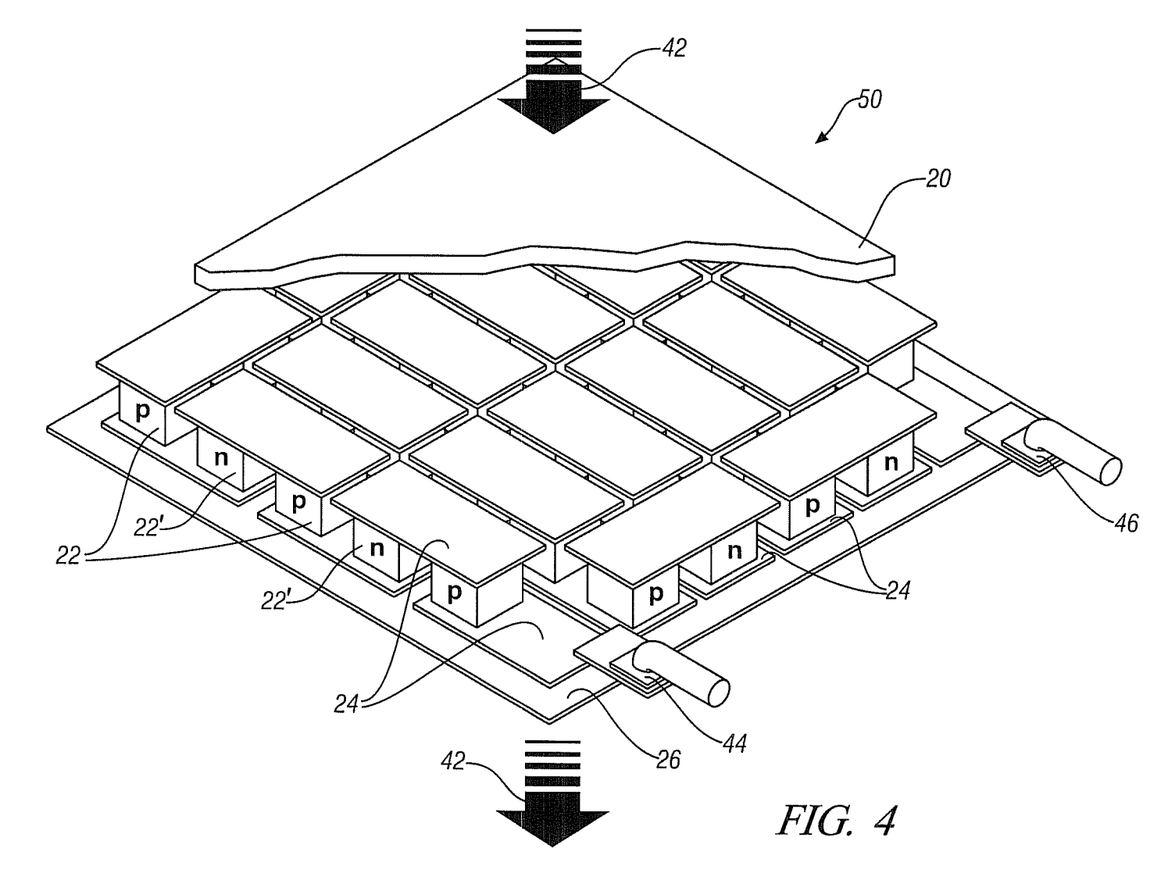
FIG. 4 shows, in partial cutaway, a perspective view of a representative thermoelectric module.

As best shown at FIG. 4, each thermoelectric module 50 comprises a plurality of dissimilar thermoelectric elements 22, 22', here shown as semiconducting elements, where 22 represents a p-type element and 22' represents an n-type element. The individual elements 22 and 22' are electrically connected one to another by a plurality of electrical interconnects 24 and are mounted between first electrically non-conducting mounting plate 20 and second electrically non-conducting mounting plate 26. Exposure of mounting plate 20 to an elevated temperature in conjunction with exposure of mounting plate 26 to a lower temperature enables heat flow 42 and results in module 50 generating electrical energy accessible through connectors 44 and 46. Filled or partially-filled skutterudites based on $Co_4Sb_{12}$ are preferably employed as the semiconducting elements with composition $Ce_xCoFe_3Sb_{12}$, with x taking values of between 0 and 1, being most preferred for the p-type elements, and composition $Ba_{0.08}La_{0.05}Yb_{0.04}Co_4Sb_{12.05}$ being most preferred for the n-type elements. However, other filled or partially filled skutterudites based on $Co_4Sb_{12}$ with 'guest' or filler atoms which may be one or more of Na, K, Ca, Sr, Ba, Ce, Pr, Nd, Sm, Eu, Gd, La and Yb in suitable proportion may also be used.

Returning to FIG. 3, the first electrically non-conducting mounting plate 20 is placed in thermal contact with outer wall 19 of octagonal thin walled tube 18, while the second-electrically conducting mounting plate 26 is embedded in a thermally-conductive, flowable paste 28 in thermal contact with inner wall 29 of round thin-wall tube 30. Suitable thermally-conductive pastes include Omegatherm OT-201 Thermally Conductive Silicone Paste (Omega Engineering, Inc., Stamford, Conn.) and AOS Non-Silicone XT-3 Heat Sink Compound (AOS Thermal Compounds, Eatontown, N.J.). Typically electrically non-conducting mounting plates 22 and 26 are fabricated of aluminum oxide ($Al_2O_3$) but other materials such as aluminum nitride (AlN) with better thermal conductance may be employed.

Thermoelectric modules are generally square in plan view and may be obtained in a range of plan view dimensions from about 10 mm×10 mm to about 60 mm×60 mm, most commonly 30 mm×30 mm and 40 mm×40 mm, with a typical height, including the non-conducting mounting plates, of between 3 and 5 mm. For optimum output, the plan view dimensions of the module should be chosen to be consistent with the dimensions and geometry of the mounting surface. For example the dimension of the mounting surface of the octagonal tube 18, shown in FIG. 2, is indicated as "d". Modules of plan view dimension "d" or multiple modules whose plan view dimensions sum to "d" will enable placement of the maximum number of modules on the outer surface 19 of thermally-conductive tube wall 18 and thus, promote maximum electricity generation.

The gap between the outer wall 31 of round thin wall tube 30 and the inner wall 37 of round thin wall tube 38 is filled with low temperature phase-change material 32 within which are positioned channels 34 for passage of coolant 36. As will be made clearer subsequently, low temperature phase-change material 32 serves to moderate the impact of exhaust gas temperature changes on the cold junction temperature of thermoelectric module 50.

It will be appreciated that the specific geometry depicted is exemplary and not limiting, and that other configurations and arrangement may be adopted by the elements shown. For example, coolant channels 34, and associated coolant 36, may be omitted and cooling of the low temperature phase-change material accomplished by passage of ambient air over outer surface 39 of round thin wall tube 38. Further, outer surface 39 of thin wall tube 38 need not be smooth, but could have fins or similar features to promote more efficient heat transfer to ambient air. Similarly, any of tubes 14, 18, 30 and 38 may exhibit a wide range of cross-sections including round, oval, polygonal or regular polygonal without restriction to the scope of the invention. Likewise a conformable thermally-conductive medium which does not deteriorate at the service temperatures of interest, analogous to the thermally-conductive paste 28 shown applied to inner surface 29 of tube 30 may be applied to outer surface 19 of tube 18, to enhance thermal contact with mounting surfaces 20 and 26 of thermoelectric module 50. Thermally conductive paste 28, or analogous material, may also be used to advantage to fill any microscopic gaps, arising, for example due to surface roughness, between two nominally flat, contacting surfaces.

Figure 5:
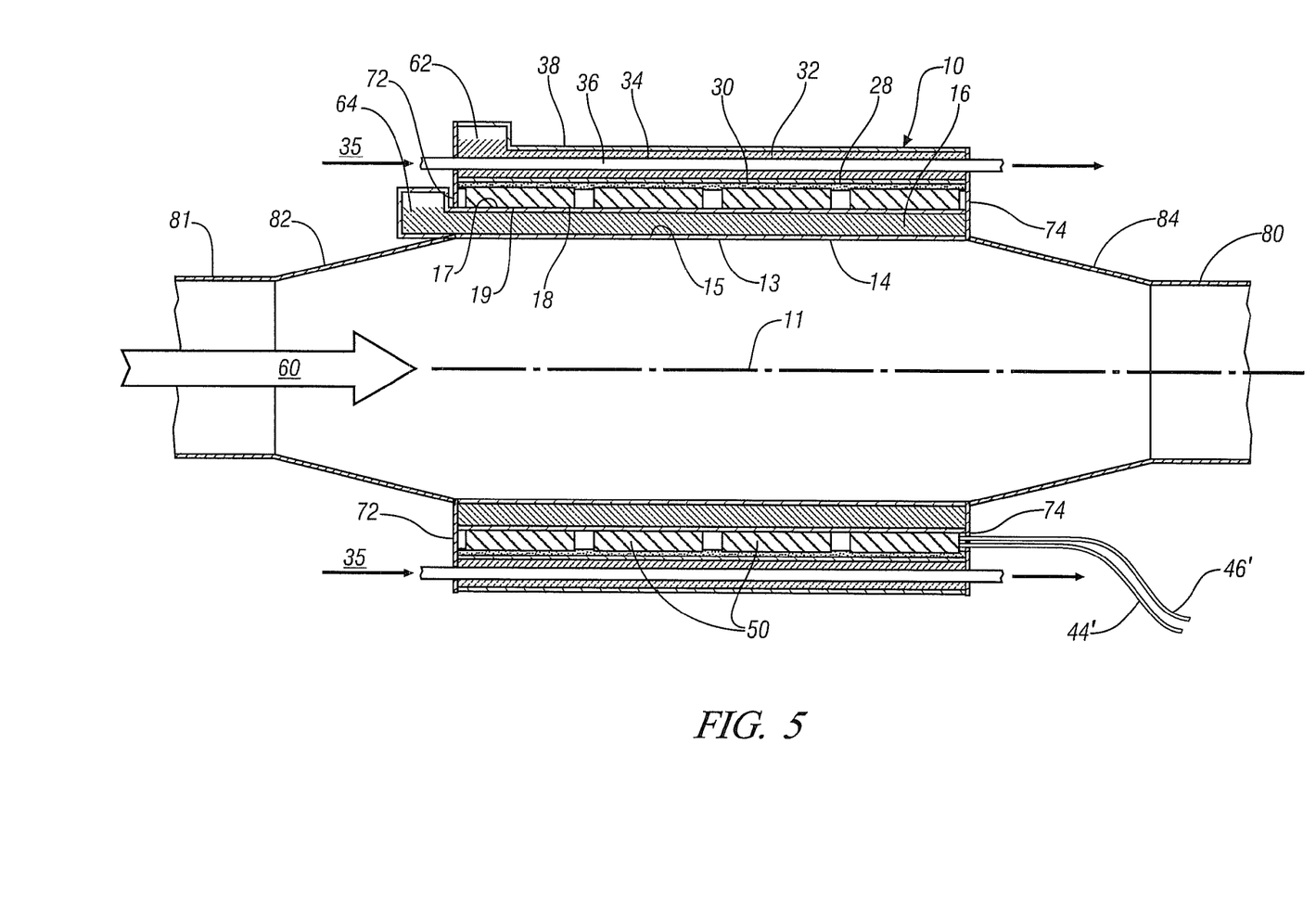
FIG. 5 shows a longitudinal section of the exemplary thermoelectric device shown in FIG. 3.

FIG. 5 shows a longitudinal cross-sectional view of the thermoelectric device 10 incorporating attachment segments 82 and 84 and indicates how it might be inserted between segments of exhaust pipe 80, 81, shown in fragmentary view, of a vehicle. Details of the method(s) of permanently or releasably securing and attaching segments 82 and 84 to exhaust pipes 80 and 81, including welding, or bolted-together flange joints, or clamped slip-fit joints, are well known to those skilled in the art and are not shown.

Thermoelectric device 10 is depicted as having a diverging section 82 and a converging section 84 and a larger inner dimension than that of exhaust pipes 80, 81. Such geometry has several benefits. It enables a greater surface area inner surface 13 of octagonal tube permitting placement of increased area of thermoelectric modules and promoting greater electric power output. Also, it will result in a local reduction of exhaust gas flow rate, permitting longer dwell of the exhaust gas within thin wall tube 14, and thereby enable more complete extraction of the thermal energy of the exhaust gases for increased electrical output. While preferred, such a configuration is not required. Various relative dimensions of exhaust pipes 80, 81 and inner tube 14 may be adopted, responsive to, for example, packaging constraints, without prejudice to the scope of the invention.

The tube openings are closed substantially by annular endcaps 72 and 74 acting in conjunction with reservoirs 64 and 62. Endcaps 72 and 74 are individually attached to each of tubes 14, 18, 30 and 38 by suitable means, for example by brazing, to form individual compartments to contain and segregate the phase-change materials and the thermoelectric modules. Thus, both of the low temperature phase-change material 32 and high temperature phase-change material 16 are contained within their respective volumes. Similarly the region between thin wall tubes 18 and 30, occupied by thermoelectric modules 50 and thermally conductive paste 28 is sealed. This region may be evacuated or filled with an inert gas to preclude or minimize oxidation or volatilization of the thermoelectric elements 22, 22' (FIG. 4) and paste 28.

Exhaust gases flow along and through the passage formed by inner surface 13 of the wall of thin wall tube 14 in a direction indicated by arrow 60 and transfer heat through wall 14 to a first phase-change material 16. The phase-change material is generally contained within the gap volume between tubes 14 and 18 bounded by end caps 72 and 74 but also including enclosed external volume 64. The phase-change material is typically a solid at ambient temperature of about 25° C. and melts at a temperature comparable to but no greater than the maximum preferred operating temperature of the thermoelectric module.

Phase-change materials function as efficient, substantially-constant temperature heat reservoirs and typically employ the phase change of a solid to a liquid and vice versa. When a solid is heated to its melting point and melted, it stores energy as latent heat and releases it when it cools and solidifies. Pure materials, congruently melting alloys or compounds, or eutectic compositions of alloys and compounds melt at a fixed temperature. Thus, a phase-change material consisting of one of these species of materials is capable of absorbing and releasing heat without increase or decrease in temperature at its melting point for as long as it contains both solid and liquid. As such it is capable of buffering the thermoelectric module from temporary variations in exhaust gas temperature. Thus, for example, a short-term increase in exhaust gas temperature will convey additional heat to the phase-change material and, in consequence, result in melting of some additional solid material. However, since melting occurs at constant temperature the thermoelectric module will continue to experience a generally constant hot junction temperature. Similarly, a short-term reduction in exhaust temperature will initiate freezing of some of the liquid and release of heat to again maintain the thermoelectric module hot junction at a generally constant temperature.

At all other temperatures, that is, when the phase-change material is entirely solid or entirely liquid, the phase-change material will behave typically, increasing its temperature as it absorbs heat and decreasing its temperature when it releases heat. Also the quantity of heat which may be stored in a phase-change material will depend on its volume (or mass). Thus, the volume (or mass) of phase-change material should be preselected in accordance with both the magnitude of the anticipated variability in exhaust gas temperature and the duration of such variation. A convenient basis for such a determination may be the exhaust gas temperature variation encountered during dynamometer test procedures conducted for establishing comparative fuel economy data. An example may be the U.S. FTP-72 (Federal Test Procedure) cycle which is intended to be representative of an urban driving cycle.

For maximum effectiveness and utility in this application, the phase change temperature of the selected material should closely correspond to the desired operating temperature of the thermoelectric device. Exemplary materials and binary alloys which melt at temperatures of between about 350° C. and 415° C. and would therefore be compatible with the filled skutterudite thermoelectric compositions mentioned earlier include (Melting Points in parentheses): $Al_{0.33}Zn_{0.67}$ (382° C.); $Ca_{0.22}Zn_{0.78}$ (385° C.); $Ba_{0.65}Mg_{0.35}$ (358° C.); $Cu_{0.14}Sn_{0.86}$ (415° C.); KOH (360° C.); $ZnBr_2$ (394° C.); and InI (351° C.). It will be appreciated that an additional requirement is that the phase-change material should be compatible with its containment materials and should at least not react with, alloy with, corrode or embrittle these containment materials.

The volume of phase-change material required will vary based on a number of factors including the engine efficiency, the latent heat/unit volume of the phase-change material and the volume of exhaust gas emitted. Of course the exhaust gas volume will generally also vary with engine capacity.

As an example, consider a large SUV with a 5.3 L, V-8 engine and a curb weight of about 2700 kilograms. Such a vehicle is expected to generate recoverable exhaust energy of about 350 watts averaged over the entire urban FTP cycle, but generate a peak output of about 750 watts for a maximum of about 180 seconds. Thus, if the thermoelectric system is sized and adapted to accommodate the 350 watt average output, the quantity of phase change material should be selected to temporarily sequester the short-term power excess of about 20 watt-hours (750−350=400 watts excess over 180 seconds=$\frac{1}{20}$ hour). If the selected phase-change material is the $Cu_{0.14}Sn_{0.86}$ alloy which has a heat of fusion of about 20 watt-hours per kilogram, then about 1 kilogram of phase change material would be required. While the specific example cited is illustrative, and not limiting, it will be appreciated that the described procedure may readily be adapted and applied to other vehicles and operating conditions.

By considering FIGS. 4 and 5 in conjunction, it is clear that heat transferred through high temperature phase-change material 16 will raise the temperature of the hot side, that is the side corresponding to electrically non-conducting mounting surface 22, of thermoelectric module 50. Second electrically non-conducting mounting surface 26, in good thermal contact with thin wall tube 30 through thermally conductive paste 28 is maintained at low temperature by low temperature phase-change material 32, here shown as cooled by passage of engine coolant 36 in channels 34 in direction indicated by arrows 35. Thus, a temperature gradient is established across the individual thermoelectric elements 22 and 22' producing electrical energy which may be extracted by conductors 44' and 46' connected to connectors 44 and 46.

An important characteristic of thermoelectric materials is that they possess a low thermal conductivity so that the temperature difference between the hot and cold junctions of the device may be maintained. However, even low thermal conductivity materials will allow passage of some heat and establish a temperature gradient based on a balance between the rate at which heat is conducted by the thermoelectric elements and the rate at which the heat is lost at the cold junction. Generally the rate of heat loss by the cold junction depends on the temperature of the junction and the thermal environment in the immediate vicinity of the junction. Under a stable thermal environment, the temperature of the cold junction may remain relatively stable and a low temperature phase-change material in thermal communication with the low temperature junction may not be necessary.

However, if the thermal environment is not adequately stable there may be significant variation in cold junction temperature. In this situation it may be therefore preferred to maintain a more stable cold junction by using a second, low temperature phase-change material as a heat sink for the cold junction.

The low temperature phase-change material is selected for compatibility with the expected operating temperature of the cold junction of the thermoelectric module. In the circulating engine coolant configuration shown, a material undergoing a phase change at about normal engine coolant temperature, typically between 90° C. and 100° C. should be used. Numerous low melting point phase-change materials are available commercially with phase change temperatures from about 10° C. to 100° C. Some examples suitable for use with 90-100° C. coolant include (melting points indicated in parentheses): E89 (89° C.) and E83 (83° C.)—both available from EPS Limited, Yaxley, UK; H 89 (89° C.)—available from TEAP Energy, Wangara Dc, Australia; and RT 90 (90° C.)—available from RubiTherm GmbH, Berlin, Germany. In addition numerous low melting point metallic alloys based on eutectic or near-eutectic binary, ternary or quaternary alloys of bismuth, tin, lead, cadmium and indium are known. The melting points of numerous of these alloys lie in the range of from about 35° C. to 100° C.

Thus, any of a plurality of available phase-change materials having a phase change temperature substantially equal to the temperature of the low temperature junction may be selected. In turn the temperature of the low temperature junction will be dictated by the temperature of the cooling medium and its ability to extract all the heat conducted through the elements. Thus, the engine coolant may be passed through a separate reservoir to further lower its temperature, or liquid cooling may be dispensed with entirely and forced air cooling employed. These strategies may result in a lower cold junction temperature than achievable using 90-100° C. engine coolant and necessitate a choice of phase-change material which differs from some of the examples cited.

Like the hot junction phase-change material, cold junction phase-change material 32 (FIG. 5) is fully contained within the gap between thin wall tubes 30 and 38 and bounded on one end by segments of endcap 72 and 74 and reservoir 62. Channels 34 which are embedded within phase-change material 34 are sealed as they penetrate endcaps 72, 74.

Reservoirs 62 and 64 serve to accommodate the volume changes attendant on both thermal expansion and, more importantly, on the transformation of the solid phase-change material to liquid. It is preferred that the entire available volume for retention of the phase-change material be filled when the phase-change material is liquid. Thus, reservoirs 62 and 64 will be filled with liquid elevated above the level of the remaining phase-change material. On cooling, as the phase-change material contracts during solidification the liquid stored in reservoirs 62 and 64 will be gravity fed to compensate for the shrinkage. It may be noted that the reservoir is positioned adjacent to the hot incoming exhaust gas and should therefore be the last region to solidify. Also the first region of the phase-change material to solidify is expected to be where the exhaust gas is coolest, that is adjacent to endplate 74. Thus, reservoirs 62 and 64 are well positioned to feed liquid to compensate for the liquid to solid volume change throughout the solidification process. It will be appreciated that in the absence of such reservoirs the resulting uncompensated volume contraction of the material could lead to shrinkage cavities which would interfere with heat flow through the phase-change material.

Figure 6:
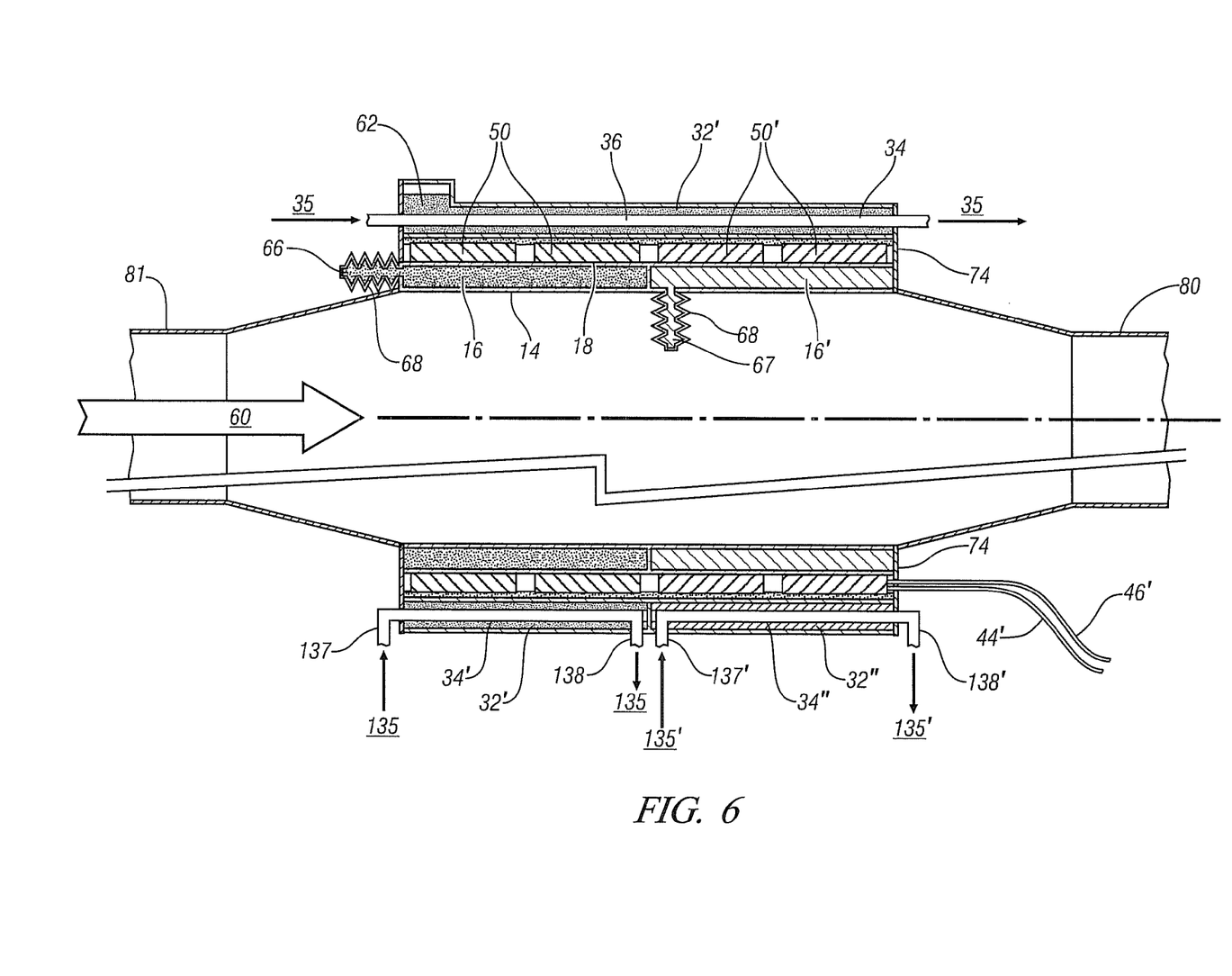
FIG. 6 shows in composite a second embodiment of a thermoelectric device incorporating a plurality of thermoelectric modules in thermal communication with a high temperature phase-change material at their hot junction and a low temperature phase-change material at their cold junction. Two configurations of low temperature phase-change materials are illustrated.

From inspection of FIG. 5 it is apparent that the thermoelectric modules 50, in addition to being disposed around tube 14 also extend along the length of the thermoelectric device. FIG. 6 shows, in composite view, two aspects of a second embodiment of the invention which seeks to further enhance the efficiency of such an extended thermoelectric device.

The heat stored in the exhaust gas is finite so that as it progresses along the length of tube 14 the exhaust gas will lose heat to the thermoelectric modules and the exhaust gas temperature will progressively decrease. The effect of some degree of temperature decrease on thermoelectric efficiency may be mitigated by the ability of the phase-change material to maintain a constant temperature. However, if the temperature decrease is significant it will exceed the capability of the high temperature phase-change material to moderate it. In this case, the choice of the thermoelectric element material will be a compromise since the 'peaked' thermoelectric efficiency versus temperature response will necessarily result in only some portion of the modules operating in their optimum temperature range. To counter this decrease in efficiency, two separate groups of thermoelectric modules 50, 50' of different composition may be employed as shown in FIG. 6. Preferably each group of thermoelectric modules is selected and positioned in a temperature zone within tube 14 for operation at its maximum efficiency. Further, each group is associated with its individual high temperature phase-change material 16, 16' selected for phase change temperature compatibility with the temperature at which the thermoelectric modules operate most efficiently.

Two configurations of the low temperature junction are shown. In one aspect, a single volume of low temperature phase-change material 32' spans the length of the device and is cooled by a flow of engine coolant 36 contained within channels 34 and flowing in the direction indicated by arrow 35. In a second aspect, separate volumes, each containing differing low temperature phase-change materials 32' and 32" are associated with and positioned in alignment with each of thermoelectric modules 50 and 50' and their respective high temperature phase-change material volumes 16 and 16'. Further, each low temperature phase-change volume is individually cooled by passage of engine coolant. The volume containing low temperature phase-change material 32' is cooled by flow indicated by arrows 135 and entering at inlet 137 and exiting at exit 138: the volume containing low temperature phase-change material 32" is cooled by a flow indicated by arrows 135' entering at inlet 137' and exiting at exit 138'.

The embodiment of FIG. 6 has been described and illustrated with reference to only two groups of thermoelectric devices. It will, however, be apparent that extension of the embodiment to incorporate yet additional thermoelectric modules and associated phase-change materials may be contemplated.

The reservoirs for the high temperature phase-change materials differ from that shown in FIG. 5 and indicated by 62 for the low temperature phase-change material. Reservoirs 66, 67 comprise expandable metal bellows 68, which in an unloaded state are fully collapsed but expand and increase their storage volume in response to volume expansion of the liquid and contract and reduce their storage volume as the liquid solidifies and contracts. The reservoirs are positioned at the hottest location experienced by the respective phase-change material so that any material contained within the reservoir will be the first to melt and the last to solidify for the reasons previously detailed. Reservoir 66 may be positioned external to thin wall tube 14, but reservoir 67 may be located in the exhaust flow as shown.

Figure 7:
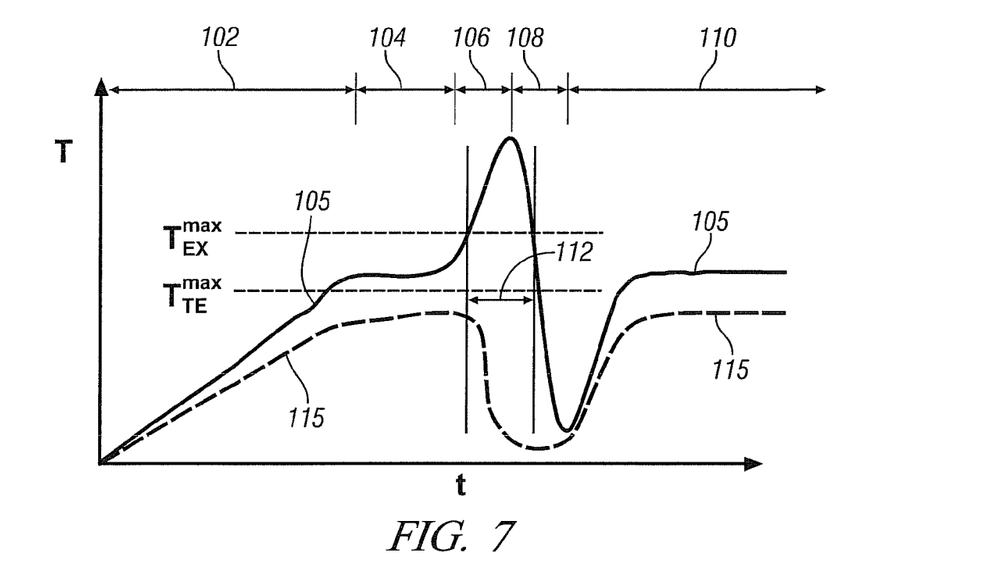
FIG. 7 is a schematic representation of the variation of engine exhaust gas temperature with time, resulting from a series of engine operating modes. Also shown is the resulting temperature of the hot junction of the thermoelectric device which does not employ a phase-change material at the hot junction and which employs an exhaust gas diversion system to protect against overheating of the thermoelectric device. The maximum temperature which can be sustained by the thermoelectric device is indicated as $T_{TE}^{max}$ and the corresponding exhaust gas temperature as $T_{EX}^{max}$.
Figure 8:
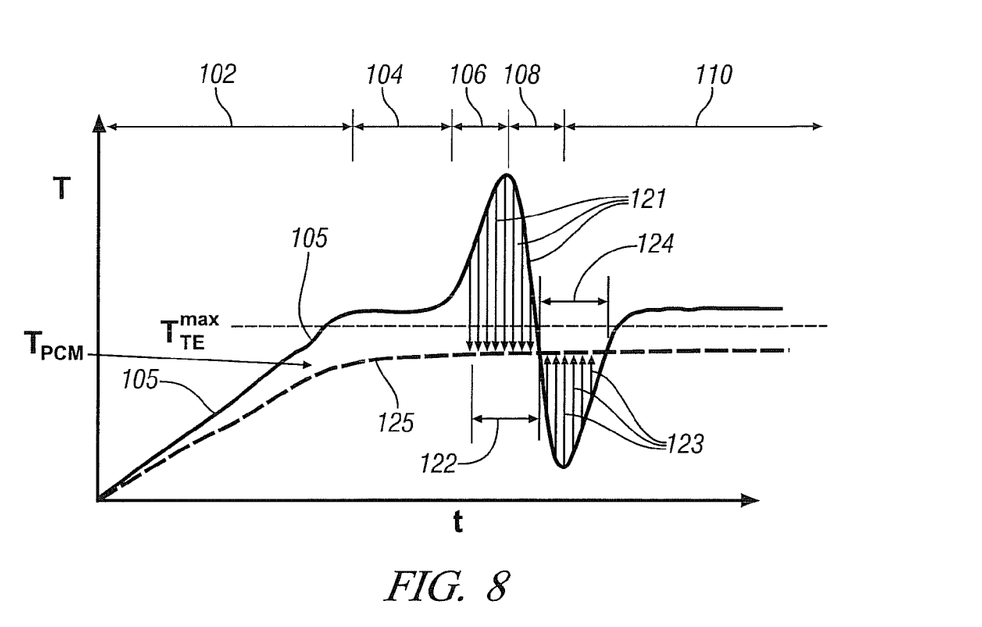
FIG. 8 is a schematic representation of the variation of engine exhaust gas temperature with time resulting from a series of engine operating modes, and is identical to that shown in FIG. 7. Also shown is the resulting temperature of the hot junction of the thermoelectric device which employs a phase-change material at the hot junction. The maximum temperature which can be sustained by the thermoelectric module is indicated as $T_{TE}^{max}$.

The benefits of coupling phase-change materials with thermo electric devices may be readily appreciated by consideration of FIGS. 7 and 8 which illustrate the effects of change in engine operating conditions on the operation and performance of thermoelectric devices with (FIG. 8) and without (FIG. 7) the phase-change materials.

Consider first the behavior when the phase-change materials are absent. FIG. 7 plots the temperature (T) of the exhaust gases, curve 105, and the hot junction of the thermoelectric device, curve 115, with time (t) over periods 102-110 representing varying engine operating conditions, starting from a cold engine. Initially, as the engine is started and begins to warm up, the exhaust temperature progressively increases as shown in time period 102. The temperature of the hot junction of the thermoelectric device, curve 115, likewise increases but is lower than and lags the temperature of the exhaust gas. When the engine has reached its normal operating temperature and is operated at some steady state, period 104, the exhaust temperature 105 exhibits a temperature plateau. The thermoelectric device junction temperature 115 similarly shows a plateau but at a lower temperature.

Also shown on FIG. 7 are the maximum operating temperature of the thermoelectric device, $T_{TE}^{max}$ and the corresponding exhaust temperature, designated as $T_{EX}^{max}$. In time period 106 the engine is operated under heavy load, for example hard acceleration, and the exhaust gas temperature rapidly increases and exceeds $T_{EX}^{max}$. Continued passage of the exhaust gas over the thermoelectric device would cause its hot junction temperature to exceed $T_{TE}^{max}$. To avoid this, the exhaust gas is intercepted and diverted, by methods to be described later, and directed along another path which bypasses the thermoelectric device, so that during time period 112 the thermoelectric device is not exposed to exhaust gas and cools. At the end of time period 106, the engine condition reverts to an idle condition and during time period 108 the exhaust temperature drops. As it drops below $T_{EX}^{max}$, signaling the end of period 112, the exhaust gas is again directed to flow over and heat the thermoelectric device hot junction so that its temperature begins to rise. In time period 110, the engine is operated at steady state and maintains a generally constant exhaust gas temperature of less than $T_{EX}^{max}$. Correspondingly the thermoelectric device temperature is maintained at a safe operating temperature of less than $T_{TE}^{max}$.

FIG. 8 shows the behavior of a similar thermoelectric module in which both the hot and cold junctions are maintained in thermal contact with an appropriate phase-change material subject to the same progression in engine operating conditions and exhaust gas temperatures illustrated in FIG. 8. Comparison of FIGS. 7 and 8 indicates that the behavior of this configuration, represented by exhaust gas temperature curve 105 and thermoelectric hot junction temperature curve 125, is substantially equivalent to that of the configuration without the phase-change materials. However, dramatic differences are apparent under the heavy load condition of time period 106. With the ability of the thermoelectric material to absorb heat isothermally, no increase in thermoelectric junction temperature, curve 125 results during time period 106 despite the rapid increase in exhaust gas temperature manifested by curve 105. With this absorption of heat by the phase-change material occurring during time period 122, and represented by downwardly-pointing arrows 121, it is unnecessary to divert the exhaust gas and maximum output may be derived from the thermoelectric device without concern for overheating the thermoelectric device. During engine idle, time period 108, and the resultant decrease in exhaust gas temperature, the release of heat from the phase-change material during time period 124 and represented by upwardly-pointing arrows 123, continues to maintain a generally constant thermoelectric device hot junction temperature. Again this constancy of temperature at the hot junction of the thermoelectric device will promote obtaining maximum power out from the device, in this case, even under low exhaust temperature engine operating regimes. Resumption of steady state operation during time period 110 yields a device response substantially identical to that shown in FIG. 7 during the same time period.

Figure 9:
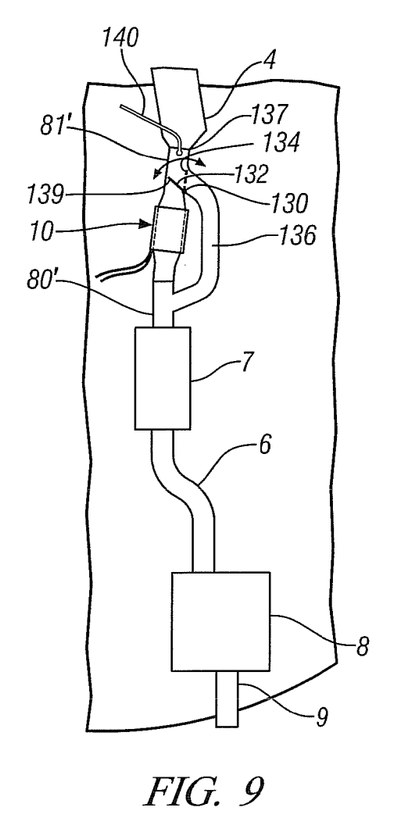
FIG. 9 shows, in view substantially identical to that of FIG. 1, modification of a vehicle exhaust to incorporate a diverter pipe to enable the exhaust gas to by-pass the thermoelectric device.

In discussion of the temperature profiles shown in FIG. 7, it was noted that under some engine operating conditions it may be necessary to divert the exhaust gases to avoid overheating and thereby degrading the thermoelectric device. A method for diverting the gases on demand is illustrated in FIG. 9 which shows a portion of the exhaust system shown in FIG. 1 and incorporating modified exhaust tube segments 80' and 81' to which is attached diverter pipe 136. Diverter pipe 136 blends into tube segments 80' and 81' in a 'Y' configuration which minimizes fluid disturbances and minimizes creating additional back-pressure which might interfere with efficient engine operation. At the point of the 'Y' comprising diverter pipe 136 and tube 81' is mounted flapper valve 132, rotating about pivot 130 located at the point of the 'Y' and capable of being rotated about pivot 130 along the arc indicated by double-ended arrow arc segment 134. When flapper valve 132 is positioned with its end at location 137, the exhaust gas will flow through thermoelectric device 10; when flapper valve 132 is positioned with its end at location 139, the exhaust gas will flow through diverter pipe 136. Thus, in response to a temperature signal responsive to exhaust gas temperature, measured, for example by thermocouple 140, a controller (not shown) could actuate, for example by an electric motor (not shown), flapper valve 132 to controllably direct the exhaust gases through thermoelectric device 10 or diverter pipe 136. It will be appreciated that with this setup the exhaust gas flows through either the diverter pipe 136 or the thermoelectric device 10 so that a simple ON-OFF controller is adequate. When the exhaust gas temperature falls below $T_{EX}^{max}$, the exhaust gas flow would be redirected through the thermoelectric device. Some hysteresis may be incorporated to avoid rapid cycling between the ON and OFF conditions.

The above-described control strategy, responsive only to exhaust gas temperature, is conservative and takes no advantage of the temperature-stabilizing characteristics of the high temperature phase-change material.

For devices 10 which incorporate phase-change materials it is preferred to employ the temperature of the phase-change material to initiate diversion of the exhaust gas stream and employ the phase-change material to accommodate short-term exhaust gas temperature deviations. Thus, initially, the thermoelectric device will be isolated from the effects of an exhaust gas temperature in excess of $T_{EX}^{max}$ by the heat absorbing behavior of the high temperature phase-change material as illustrated in FIG. 8. However, the period during which the high temperature phase-change material will be effective in stabilizing the temperature and buffering the thermoelectric modules from exhaust gas temperatures of greater than $T_{EX}^{max}$ is necessarily limited by the volume or mass of thermoelectric material used. Under some conditions, for example under sustained heavy load like that experienced when climbing a long steep grade or towing a heavy trailer, the entire volume of phase-change material could melt and thereby be rendered incapable of further heat absorption leading to overheating of the thermoelectric modules. Since, in this circumstance, no change in exhaust gas temperature is contemplated, measurement of the exhaust gas temperature alone cannot be used to trigger diversion of the exhaust stream. Here exhaust gas diversion may predicated on direct measurement of an excessive hot junction temperature of the thermoelectric module. More preferably excessive temperature of the high temperature phase-change material would initiate diversion of the exhaust stream to the diverter pipe. Thermocouples or resistance thermometers (not shown) incorporated within thermoelectric device 10 may be employed to sense these temperatures.

Figure 10:
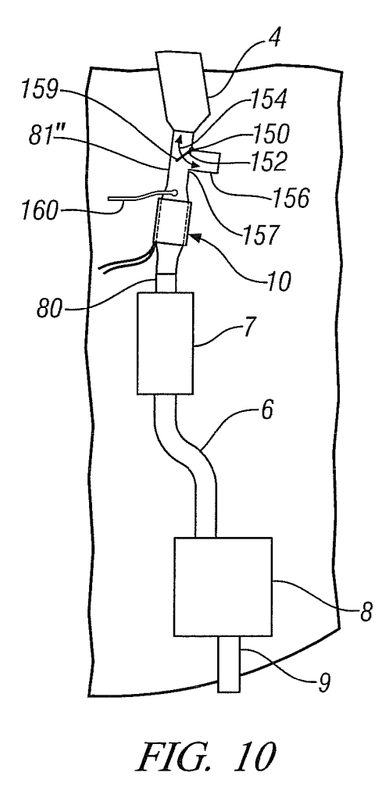
FIG. 10 shows in view substantially identical to that of FIG. 1, modification of a vehicle exhaust to incorporate a vent pipe to admit diluent air into the vehicle exhaust gas stream to reduce the gas temperature.

An alternative approach to guard against excessive thermoelectric module temperatures is illustrated in FIG. 10. In this configuration an air inlet 156, open to ambient air is incorporated in modified exhaust tube segment 81" and the inflow of diluent air is controlled by a flapper valve 152 pivoting about pivot 150 along the arc indicated by double-ended arrow arc segment 154 may be employed to introduce diluent ambient air into the exhaust stream through inlet pipe 156 to reduce the temperature of the exhaust gas. In this configuration when the end of flapper valve 152 is positioned at location 157 no dilution of the exhaust will occur; when the end of flapper valve 152 is positioned at some location intermediate between locations 157 and its maximum setting, shown as 159, the gas passing through thermoelectric device 10 will be a mixture of exhaust gas and air. In this configuration thermocouple 160 could be used, in conjunction with a controller (not shown) and valve actuator (not shown) to control the flowing gas temperature to approximate the maximum sustainable temperature of the thermoelectric device and employ the phase-change material to 'fine tune' the temperature of the device. Again, in implementation of such an approach it will be necessary to ensure that excessive back pressure is not generated. In this approach a more sophisticated controller and additional sensors will be required. The controller should be at least a proportional controller but yet more capable controllers such as proportional-integral (PI) or proportional-integral-derivative (PID) controllers may be employed. It will also be necessary to sense the position of flapper valve 152, either by a sensor mounted directly on the valve or integrated with the actuator.

While some practices of the invention have been illustrated, these embodiments are intended to illustrate the invention but not to limit its scope.

The invention claimed is:

1. An exhaust system for an internal combustion engine, with circulating coolant, for driving an automotive vehicle, the exhaust system comprising:
    an engine with an exhaust manifold from which a exhaust stream of combustion gas is expelled by engine operation, the exhaust gas having temperatures varying over a temperature range;
    an exhaust gas conduit system for conducting the gas in a contained flow path from the exhaust manifold to a gas-flow terminus at which the exhaust gas is discharged from the vehicle, the contained flow path having a location with a perimeter for transfer of heat and thermal energy from the exhaust gas to a thermoelectric device;
    the thermoelectric device comprising at least one thermoelectric module for generating electrical energy from the thermal energy of the exhaust, the thermoelectric device having a high temperature side and a low temperature side, and being shaped and placed around the perimeter of a portion of the exhaust gas flow path with the high temperature side of the thermoelectric device in heat transfer contact with the flowing exhaust gas stream; and
    a first body of thermally conductive material, solid at ambient temperature, contained and interposed around the perimeter of the exhaust gas flow path and between the exhaust gas and the high temperature side of the thermoelectric device, the contained, thermally conductive material providing a heat transfer path between the exhaust gas and the high temperature side of the thermoelectric device, the body of thermally conductive material having a mass and a melting point or melting range such that heat transferred from the exhaust gas elevates its temperature above ambient and melts a portion of the body of material, the latent heat of the partially melted body of material reducing the temperature at the high temperature side of the thermoelectric device as it is heated by the exhaust gas.

2. The exhaust system of claim 1 further comprising a contained, second body of thermally conductive material in heat transfer contact with the low temperature side of the thermoelectric device, the second body of thermally conductive material having a mass and a melting point or melting range such that heat transferred from the exhaust gas and through the thermoelectric device melts a portion of the second body of material, the latent heat of the partially melted second body of material reducing the temperature at the low temperature side of the thermoelectric device as it is heated by the exhaust gas.

3. The exhaust system of claim 2 in which the second body of thermally conductive material is in thermal contact with circulating engine coolant.

4. The exhaust system of claim 1 further comprising a bypass pipe located in parallel with the thermoelectric device and a valve for directing the engine exhaust into heat transfer contact with the thermoelectric device or through the bypass pipe.

5. The exhaust system of claim 4 further comprising a temperature sensor, a controller and a valve actuator.

6. The exhaust system of claim 1 further comprising an air inlet upstream of the thermoelectric device, the air inlet passage having an opening to the exhaust gas conduit system which is controlled by a valve for admitting ambient air to cool the exhaust gas.

7. The exhaust system of claim 6, further comprising a temperature sensor, a controller and a valve actuator with a sensor.

8. The exhaust system of claim 1 in which the thermoelectric module comprises n-type and p-type semiconductor elements consisting essentially of filled or partially filled skutterudites comprising cobalt and antimony and with one or more filler atoms selected from the group consisting of Na, K, Ca, Sr, Ba, Ce, Pr, Nd, Sm, Eu, Gd, La and Yb.

9. The exhaust system of claim 8 in which the n-type semiconductor thermoelectric element has the composition $Ba_{0.08}La_{0.05}Yb_{0.04}Co_4Sb_{12.05}$.

10. The exhaust system of claim 2 in which the first and second bodies of thermally conductive material are confined within a first and a second volume respectively, each of the first and second volumes comprising a fixed portion and an expandable portion, the volume of each of the fixed portions of the first and second volumes being substantially equal to the volumes of the first and second conductive bodies respectively when the bodies are solid and the expandable portions of the first and second volumes being substantially equal to the volume change undergone by the first and second bodies respectively when the bodies melt completely and transform entirely to liquid.

* * * * *